(12) United States Patent
Brun et al.

(10) Patent No.: US 9,620,404 B1
(45) Date of Patent: Apr. 11, 2017

(54) STIFFENER TAPE FOR ELECTRONIC ASSEMBLY THAT INCLUDES WAFER OR PANEL

(71) Applicant: Intel Corporation, Santa Clara, CA (US)

(72) Inventors: Xavier F. Brun, Chandler, AZ (US); Arjun Krishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/963,557

(22) Filed: Dec. 9, 2015

(51) Int. Cl.
| | |
|---|---|
| *H01L 23/34* | (2006.01) |
| *H05K 7/20* | (2006.01) |
| *H01L 21/00* | (2006.01) |
| *H01L 21/683* | (2006.01) |
| *H01L 23/373* | (2006.01) |
| *H01L 25/065* | (2006.01) |
| *H01L 23/367* | (2006.01) |
| *H01L 23/498* | (2006.01) |
| *H01L 21/48* | (2006.01) |
| *H01L 23/40* | (2006.01) |

(52) U.S. Cl.
CPC ...... *H01L 21/6836* (2013.01); *H01L 21/4871* (2013.01); *H01L 23/3672* (2013.01); *H01L 23/3736* (2013.01); *H01L 23/4985* (2013.01); *H01L 25/065* (2013.01); *H01L 23/40* (2013.01)

(58) Field of Classification Search
CPC . H01L 21/78; H01L 21/4871; H01L 21/6836; H01L 23/367; H01L 23/4985; H01L 25/0753; H01L 23/36; H01L 23/3672; H01L 23/40; H01L 23/3736; H01L 25/065
See application file for complete search history.

(56) References Cited

U.S. PATENT DOCUMENTS

| | | | | | |
|---|---|---|---|---|---|
| 6,132,823 | A | * | 10/2000 | Qu | ............ C09K 5/00 165/905 |
| 2001/0051395 | A1 | * | 12/2001 | Grigg | ................. G03F 7/70416 438/107 |
| 2005/0173787 | A1 | * | 8/2005 | Zhao | ....................... H01L 23/16 257/678 |
| 2012/0238045 | A1 | * | 9/2012 | Roberts | .................... F21K 9/90 438/28 |
| 2014/0239478 | A1 | * | 8/2014 | Hong | .................. H01L 21/6836 257/698 |

* cited by examiner

*Primary Examiner* — Alonzo Chambliss
(74) *Attorney, Agent, or Firm* — Schwegman Lundberg & Woessner, P.A.

(57) ABSTRACT

A stiffener tape for a wafer. The stiffener tape includes a mounting tape; a heat spreading stiffener removably attached to the mounting tape; and an attachment film secured to the heat spreading stiffener, wherein the attachment film includes thermal conductive fillers having at least one of silver, alumina, crystalline silica, boron nitride or aluminum nitride. An electronic assembly includes a wafer; a plurality of integrated circuits on the wafer; and an attachment film covering the plurality of integrated circuits and the substrate, wherein the attachment film includes thermal conductive fillers having at least one of silver, alumina, crystalline silica, boron nitride or aluminum nitride; and a heat spreading stiffener secured to the attachment film.

17 Claims, 5 Drawing Sheets

STIFFENER TAPE FOR ELECTRONIC ASSEMBLY THAT INCLUDES WAFER OR PANEL

TECHNICAL FIELD

Embodiments described herein generally relate to a stiffener tape, and more particularly to a stiffener tape for an electronic assembly.

BACKGROUND

Some of the drawbacks with conventional electronic assemblies that include ultra-thin silicon dies mounted onto the substrates are undesirably high temperatures and warpage. The undesirably high temperatures are due to due to inadequate thermal dissipation within the electronic assembly. The warpage is due to differences in the coefficients of thermal expansion (CTE) between the ultra-thin silicon dies and the substrates.

There presently does not exist a low cost and manufacturable solution for ultra-thin die (<100 um) temperature and warpage control. Therefore, a need exists for an electronic assembly that includes an ultra-thin silicon die mounted onto a substrate where the electronic assembly (i) has reduced warpage due to CTE mismatch at room temperature and reflow temperatures; (ii) has adequate thermal dissipation; and (iii) does not require any specialized manufacturing equipment in order to fabricate the electronic assembly.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the electrical interconnect or electronic package.

Some example forms relate to a heat spreading stiffener tape for a wafer or panel level stiffener application. The heat spreading stiffener tape provides a low cost and manufacturable solution for ultra-thin die (<100 um) warpage control at both room temperature and reflow temperatures by integrating a heat spreading stiffener at the wafer or board level in a die preparation process. In addition, the using the stiffener tape may reduce the need for any specialized equipment when fabricating electronic assemblies that include ultra-thin dies.

In some forms, a thin metal/polymer film (e.g., stainless steel with adhesive) may be attached to a die using a thermally conductive attachment film at a wafer or board level. The thermal conductivity and high strength of the heat spreading stiffener and the thermal conductivity of the attachment film balances the CTE mismatch between the dies and a substrate that the die is eventually mounted on.

In addition, existing lamination processes may be used to attach the stiffener tape at a wafer or panel level. The example wafer (or panel) may also eventually be singulated using conventional die singulation processes (e.g., by sawing).

Compared to conventional techniques (e.g., using a single unit level stiffener), the stiffener tapes and electronic assemblies described herein may provide a manufacturable low cost solution by applying a thermally conductive attachment film and a thermally conductive and high strength heat spreading stiffener at a wafer (or board) level.

Some example material properties for the stiffener tape include:

| | Property | Target |
|---|---|---|
| Metal/Polymer Film | Material Type | Cu, Al, SUS, metal |
| | Thickness | 5-100 um |
| | Modulus | >70 GPa |
| | CTE (20 C.) | >15 ppm |
| | CTE (250 C.) | >15 ppm |
| DAF/DBF | Thickness | 5-50 um |
| | Post cure modulus | 1-20 GPa |
| | Pre-cure modulus | >0.1 GPa |
| | Fillers | Silica, Alumina, crystalline silica, boron nitride, aluminum nitride |
| | Thermal Conductivity (K) | >5 W/m. K |
| | ESD functionality | E5-E9 |
| | CTE-1 (25 C.) | >10 ppm |
| | CTE-2 (100-150 C.) | >40 ppm |
| | Tg | >50 C. |
| | Thermal stability | <0.5% loss at 260 C. |
| | Chemistry | Epoxy, acrylic, polyimide, silicones with crosslinkers and toughening agents |

In some forms, the stiffener tape may be a ~10-100 um high strength metal/polymer film. In addition, increased adhesion may be achieved at the metal/adhesive interface when a surface treatment is utilized (e.g., SILANE).

Figure 1:
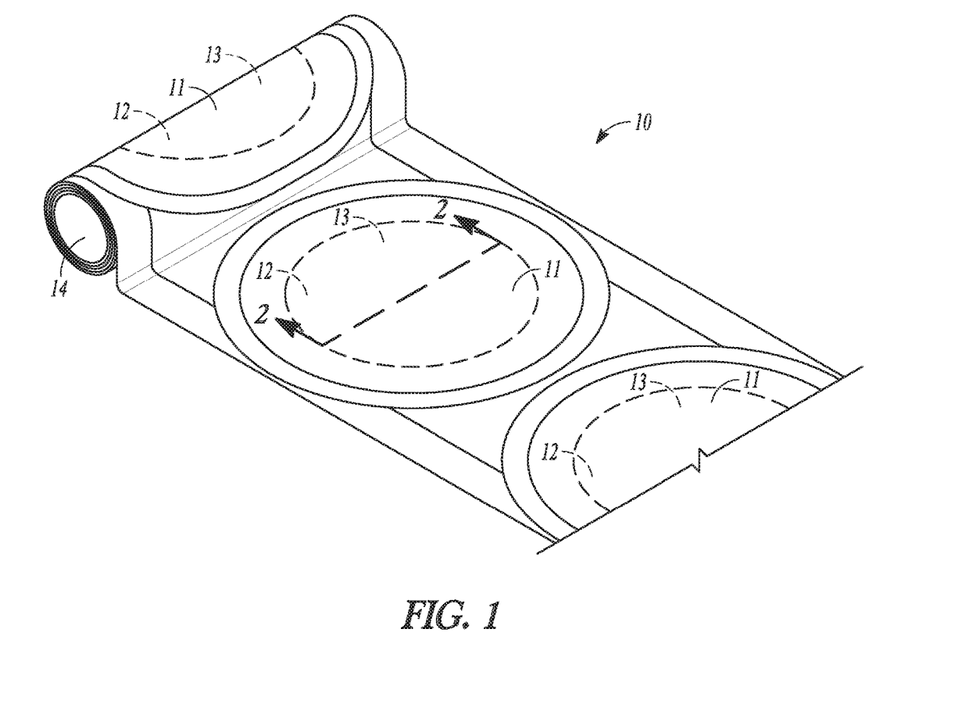
FIG. 1 illustrates an example an example stiffener tape for a wafer wherein the stiffener tape is partially unrolled.
Figure 2:
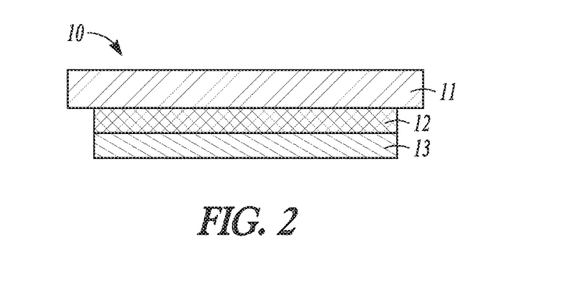
FIG. 2 illustrates the stiffener tape of FIG. 1 taken along line 2-2.

FIG. 1 illustrates an example an example stiffener tape 10 for a wafer wherein the stiffener tape 10 is partially unrolled. FIG. 2 illustrates the stiffener tape 10 of FIG. 1 taken along line 2-2. The stiffener tape 10 includes a mounting tape 11 and a heat spreading stiffener 12 removably attached to the mounting tape 11. The heat spreading stiffener tape 10 further includes an attachment film 13 attached to the heat spreading stiffener 12. As an example, the mounting tape 11 may be approximately 380-420 micrometers and the attachment film 13 may be approximately 300-330 micrometers. In addition, the heat spreading stiffener 12 may be approximately 300-330 micrometers.

In some example forms, the mounting tape 11 is a polymer film, although other materials that are known now, or discovered in the future, are contemplated. In one form, the mounting tape 11 includes polyolefins such as polypropylene, polyethylene, polylvinylchloride (PVC), polyethylene terephthalate (PET), polystyrene, polyurethane. A composite film of multiple such polymers may also be utilized. In another form, the mounting tape 11 is formed as a laminate that is made of layers of different materials (e.g., various polyolefins such as polypropylene, polyethylene, polylvinylchloride (PVC), polyethylene terephthalate (PET), polystyrene, polyurethane).

The attachment film 13 the attachment film includes thermal conductive fillers having at least one of silver, alumina, crystalline silica, boron nitride or aluminum nitride. In one form, the attachment film 13 further includes epoxy resin. As an example, the thermal conductive fillers may have a thermal conductivity greater than 5 W/mK.

In another form, the attachment film 13 further includes acrylic. In another form, the attachment film 13 further includes polyimide. In another form, the attachment film 13 further includes silicone-based cross-linking and toughening agents. In another form, the attachment film 13 is formed as a laminate that is made of layers of different materials.

In some example forms, the heat spreading stiffener 12 is a metal foil although other materials that are known now, or discovered in the future, are contemplated. In one form, the heat spreading stiffener 12 includes a stainless steel material. In another form, the heat spreading stiffener 12 includes a copper material. In another form, the heat spreading stiffener 12 includes an aluminum material. In another form, the heat spreading stiffener 12 includes at least one liquid crystal polymer. In another form, the stiffener 12 is formed as a laminate (or an alloy or composites) that is made of layers of different materials (e.g., stainless steel, copper, aluminum or liquid crystal polymers).

In addition, the size of the heat spreading stiffener 12 may be larger than a size of the wafer that the stiffener tape 10 is eventually attached in order to provide mechanical and thermal support to the wafer and any electronic assemblies that may include the wafer and the stiffener tape 10. As an example, the edges of the heat spreading stiffener 12 may be concentric with the edges of the substrate where the stiffener tape 10 is eventually attached. The size of the heat spreading stiffener 12 will depend in part on the overall design of the electronic assemblies as well as manufacturing considerations that are associated with attaching the stiffener tape 10 to a wafer (among other factors).

As shown in FIG. 1, the mounting tape 11, the attachment film 13 and multiple heat spreading stiffeners 12 are formed into a roll 14 that may be unrolled to expose individual heat spreading stiffeners 12. Individual heat spreading stiffeners 12, mounting tapes 11 and attachment films 13 may be removed from the roll 14 for subsequent attachment to a wafer. It should be noted that the heat spreading stiffeners 12, mounting tapes 11 and attachment films 13 may be in other forms besides a roll 14.

Figure 3:
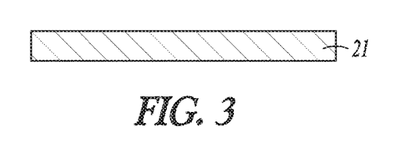
FIG. 3 illustrates a side view of an example wafer.
Figure 4:
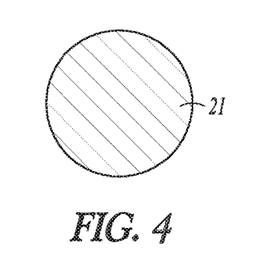
FIG. 4 illustrates a top view of wafer shown in FIG. 3.

FIG. 3 illustrates a side view of an example wafer 21. FIG. 4 illustrates a top view of wafer 21 shown in FIG. 3.

Figure 5:
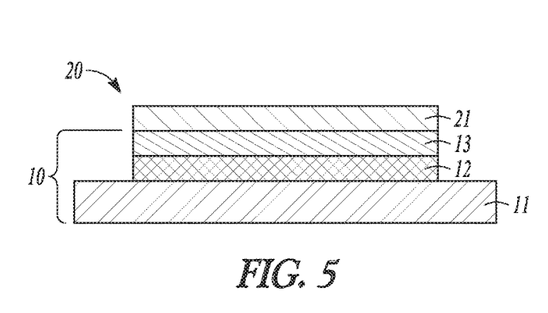
FIG. 5 illustrates the example wafer of FIGS. 3-4 after the stiffener tape of FIG. 1 has been applied to the wafer.
Figure 6:
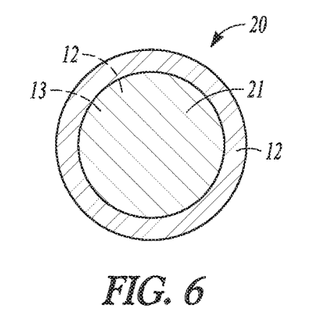
FIG. 6 is a top view of the example wafer and stiffener tape shown in FIG. 5.

FIG. 5 illustrates the example wafer 21 of FIGS. 3-4 after the stiffener tape 10 of FIG. 1 has been applied to the wafer 21 to form an electronic assembly 20. FIG. 6 is a top view of the example electronic assembly 20 shown in FIG. 5.

The stiffener tape 10 includes an attachment film 13 mounted to the wafer 21. The manner in which the stiffener tape 10 is mounted to the wafer 21 will depend in part on the types of materials that are used for the wafer 21 and the attachment film 13 (among other factors).

As an example, the wafer 21 may be formed of silicon and metal layers. The type of wafer 21 that is included in the electronic assembly 20 will depend in part on the application where the electronic assembly 20 is to be used (among other factors). In addition, the wafer 21 may be a relatively thin wafer 21 (e.g., less than 100 micron), and the stiffener tape 10 may be especially useful in providing thermal and mechanical support to a thin wafer 21.

The stiffener tapes and electronic assemblies described herein may provide improved thermal conductivity and warpage control at both room temperature as well as higher temperatures. This thermal conductivity improved warpage control may enhance the yield of thin electronic assemblies for mobile products such as wafer level packaging assemblies, smartphones, tablets and wearables.

Figure 7:
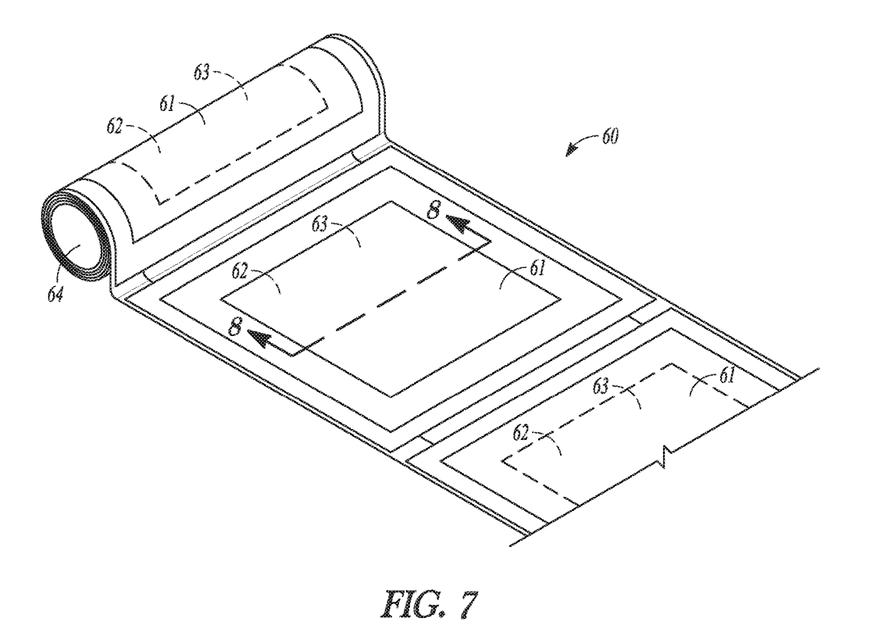
FIG. 7 illustrates an example an example stiffener tape for a panel wherein the stiffener tape is partially unrolled.
Figure 8:
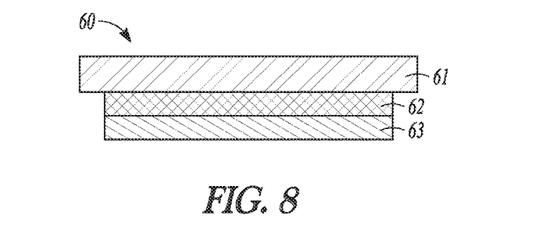
FIG. 8 illustrates the stiffener tape of FIG. 7 taken along line 8-8.

FIG. 7 illustrates an example an example stiffener tape 60 for a panel wherein the stiffener tape 60 is partially unrolled. FIG. 8 illustrates the stiffener tape 60 of FIG. 7 taken along line 8-8. The stiffener tape 60 includes a mounting tape 61 and a heat spreading stiffener 62 removably attached to the mounting tape 61. The heat spreading stiffener tape 60 further includes an attachment film 63 attached to the heat spreading stiffener 62. As an example, the mounting tape 61 may be approximately 380-420 micrometers and the attachment film 63 may be approximately 300-330 micrometers. In addition, the heat spreading stiffener 62 may be approximately 300-330 micrometers.

In some example forms, the mounting tape 61 is a polymer film, although other materials that are known now, or discovered in the future, are contemplated. In one form, the mounting tape 61 includes polyolefins such as polypropylene, polyethylene, polylvinylchloride (PVC), polyethylene terephthalate (PET), polystyrene, polyurethane. A composite film of multiple such polymers may also be utilized. In another form, the mounting tape 61 is formed as a laminate that is made of layers of different materials (e.g., various polyolefins such as polypropylene, polyethylene, polylvinylchloride (PVC), polyethylene terephthalate (PET), polystyrene, polyurethane).

The attachment film 63 the attachment film includes highly thermal conductive fillers having at least one of silver, alumina, crystalline silica, boron nitride or aluminum nitride. In one form, the attachment film 63 further includes epoxy resin. As an example, the thermal conductive fillers may have a thermal conductivity greater than 5 W/mK.

In another form, the attachment film 63 further includes acrylic. In another form, the attachment film 63 further includes polyimide. In another form, the attachment film 63 further includes silicone-based cross-linking and toughening agents. In another form, the attachment film 63 is formed as a laminate that is made of layers of different materials.

In some example forms, the heat spreading stiffener 62 is a metal foil although other materials that are known now, or discovered in the future, are contemplated. In one form, the heat spreading stiffener 62 includes a stainless steel material. In another form, the heat spreading stiffener 62 includes a copper material. In another form, the heat spreading stiffener 62 includes an aluminum material. In another form, the heat spreading stiffener 62 includes at least one liquid crystal polymer. In another form, the stiffener 62 is formed as a laminate that is made of layers of different materials (e.g., stainless steel, copper, aluminum or liquid crystal polymers).

In addition, the size of the heat spreading stiffener 62 may be larger than a size of the panel that the stiffener tape 60 is eventually attached in order to provide mechanical and thermal support to the panel and any electronic assemblies that may include the panel and the stiffener tape 60. As an example, the edges of the heat spreading stiffener 62 may be concentric with the edges of the substrate where the stiffener tape 60 is eventually attached. The size of the heat spreading stiffener 62 will depend in part on the overall design of the electronic assemblies as well as manufacturing considerations that are associated with attaching the stiffener tape 60 to a panel (among other factors).

As shown in FIG. 7, the mounting tape 61, the attachment film 63 and multiple heat spreading stiffeners 62 are formed into a roll 64 that may be unrolled to expose individual heat spreading stiffeners 62. Individual heat spreading stiffeners 62, mounting tapes 61 and attachment films 63 may be removed from the roll 64 for subsequent attachment to a panel. It should be noted that the heat spreading stiffeners 62, mounting tapes 61 and attachment films 63 may be in other forms besides a roll 64.

Figure 9:
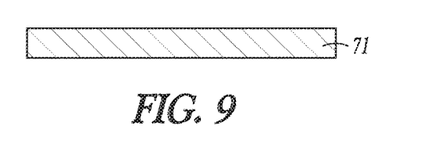
FIG. 9 illustrates a side view of an example panel.
Figure 10:
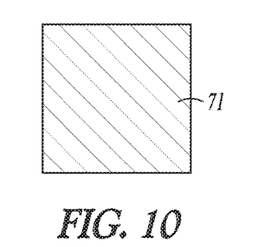
FIG. 10 illustrates a top view of panel shown in FIG. 9.

FIG. 9 illustrates a side view of an example panel 71. FIG. 10 illustrates a top view of panel 71 shown in FIG. 8.

Figure 11:
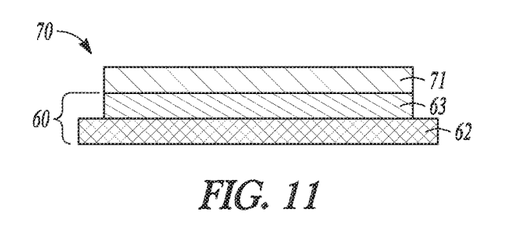
FIG. 11 illustrates the example panel of FIGS. 9-10 after the stiffener tape of FIG. 7 has been applied to the panel.
Figure 12:
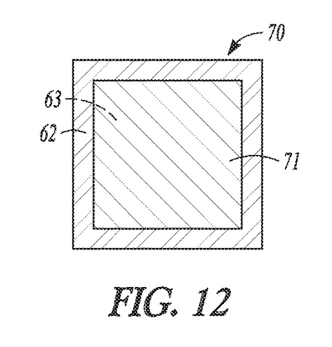
FIG. 12 is a top view of the example panel and stiffener tape shown in FIG. 11.

FIG. 11 illustrates the example panel 71 of FIGS. 9-10 after the stiffener tape 60 of FIG. 7 has been applied to the panel 71 to form an electronic assembly 70. FIG. 12 is a top view of the example electronic assembly 70 shown in FIG. 11.

The stiffener tape 60 includes an attachment film 63 mounted to the panel 71. The manner in which the stiffener tape 60 is mounted to the panel 71 will depend in part on the types of materials that are used for the panel 71 and the attachment film 63 (among other factors).

As an example, the panel 71 may be formed of silicon, metal and organic layers. In some forms, the panel 71 may be in strip form. The type of panel 71 that is included in the electronic assembly 70 will depend in part on the application where the electronic assembly 70 is to be used (among other factors). In addition, the panel 71 may be a relatively thin panel 71 (e.g., less than 100 micron), and the stiffener tape 60 may be especially useful in providing thermal and mechanical support to a thin panel 71.

The stiffener tapes and electronic assemblies described herein may provide improved thermal conductivity and warpage control at both room temperature as well as higher temperatures. This thermal conductivity and improved warpage control may enhance the yield of thin electronic assemblies for mobile products such as panel level packaging assemblies, smartphones, tablets and wearables.

Figure 13:
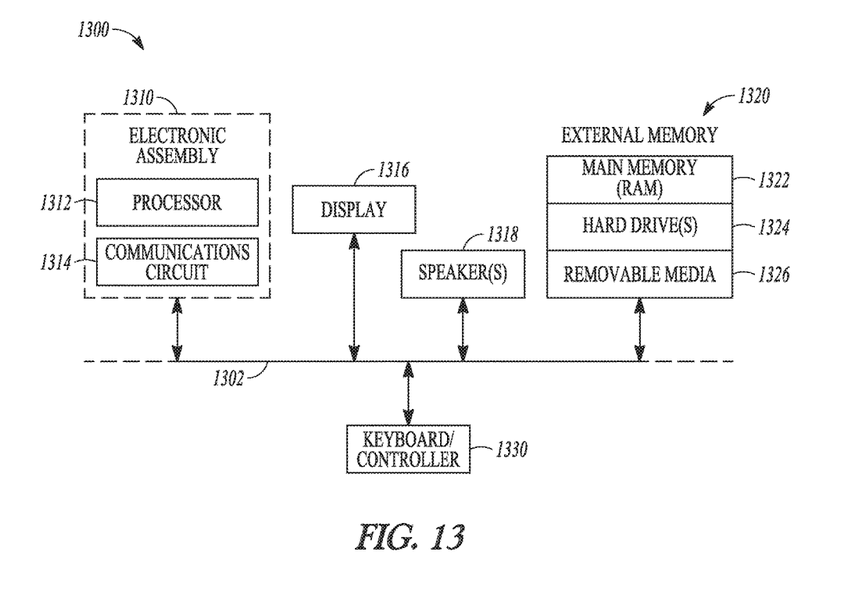
FIG. 13 is block diagram of an electronic apparatus that includes the stiffener tapes and/or electronic assemblies that include the stiffener tapes described herein.

FIG. 13 is a block diagram of an electronic apparatus 1300 incorporating at least one stiffener tapes 10, 60 and electronic assemblies 20, 70 described herein. Electronic apparatus 1300 is merely one example of an electronic apparatus in which forms of the stiffener tapes 10, 60 and electronic assemblies 20, 70 described herein may be used.

Examples of an electronic apparatus 1300 include, but are not limited to, personal computers, tablet computers, mobile telephones, game devices, MP3 or other digital music players, etc. In this example, electronic apparatus 1300 comprises a data processing system that includes a system bus 1302 to couple the various components of the electronic apparatus 1300. System bus 1302 provides communications links among the various components of the electronic apparatus 1300 and may be implemented as a single bus, as a combination of busses, or in any other suitable manner.

An electronic assembly 1310 that includes any of the stiffener tapes 10, 60 and electronic assemblies 20, 70 as describe herein may be coupled to system bus 1302. The electronic assembly 1310 may include any circuit or combination of circuits. In one embodiment, the electronic assembly 1310 includes a processor 1312 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 1310 are a custom circuit, an application-specific integrated circuit (ASIC), or the like, such as, for example, one or more circuits (such as a communications circuit 1314) for use in wireless devices like mobile telephones, tablet computers, laptop computers, two-way radios, and similar electronic systems. The IC can perform any other type of function.

The electronic apparatus 1300 may also include an external memory 1320, which in turn may include one or more memory elements suitable to the particular application, such as a main memory 1322 in the form of random access memory (RAM), one or more hard drives 1324, and/or one or more drives that handle removable media 1326 such as compact disks (CD), flash memory cards, digital video disk (DVD), and the like.

The electronic apparatus 1300 may also include a display device 1316, one or more speakers 1318, and a keyboard and/or controller 1330, which can include a mouse, trackball, touch screen, voice-recognition device, or any other device that permits a system user to input information into and receive information from the electronic apparatus 1300.

To better illustrate the stiffener tapes 10, 60 and electronic assemblies 20, 70 disclosed herein, a non-limiting list of embodiments is provided herein.

Example 1 includes a stiffener tape for a wafer. The stiffener tape includes a mounting tape; a heat spreading stiffener removably attached to the mounting tape; and an attachment film secured to the heat spreading stiffener, wherein the attachment film includes thermal conductive fillers having at least one of silver, alumina, crystalline silica, boron nitride or aluminum nitride.

Example 2 includes the stiffener tape of example 1, wherein the mounting tape is a polymer film, wherein the heat spreading stiffener is a metal foil.

Example 3 includes the stiffener tape of any one of examples 1-2, wherein the heat spreading stiffener is larger than a size of the wafer.

Example 4 includes the stiffener tape of any one of examples 1-3, wherein the mounting tape, the attachment film and the heat spreading stiffener are formed into a roll.

Example 5 includes an electronic assembly. The electronic assembly includes a wafer; a plurality of integrated circuits on the wafer; and an attachment film covering the plurality of integrated circuits and the substrate, wherein the attachment film includes thermal conductive fillers having at least one of silver, alumina, crystalline silica, boron nitride or aluminum nitride; and a heat spreading stiffener secured to the attachment film.

Example 6 includes the electronic assembly of example 5, wherein the thermal conductive fillers have a thermal conductivity greater than 5 W/mK.

Example 7 includes the electronic assembly of any one of examples 5-6, wherein the wafer is formed of silicon, metal and organic layers.

Example 8 includes the electronic assembly of any one of examples 5-7, wherein the heat spreading stiffener is larger than the wafer.

Example 9 includes the electronic assembly of any one of examples 5-8, wherein the heat spreading stiffener is a metal foil.

Example 10 includes the electronic assembly of any one of examples 5-9, wherein the metal foil is copper.

Example 11 includes a stiffener tape for a wafer. The stiffener tape includes a mounting tape; a heat spreading stiffener removably attached to the mounting tape; and an attachment film secured to the heat spreading stiffener, wherein the attachment film includes thermal conductive fillers having at least one of silver, alumina, crystalline silica, boron nitride or aluminum nitride.

Example 12 includes the stiffener tape of example 11, wherein the mounting tape is a polymer film, wherein the heat spreading stiffener is a metal foil.

Example 13 includes the stiffener tape of any one of examples 11-12, wherein the heat spreading stiffener is larger than a size of the panel.

Example 14 includes the stiffener tape of any one of examples 11-13, wherein the mounting tape, the attachment film and the heat spreading stiffener are formed into a roll.

Example 15 includes an electronic assembly. The electronic assembly includes a wafer; a plurality of integrated circuits on the wafer; and an attachment film covering the plurality of integrated circuits and the substrate, wherein the attachment film includes thermal conductive fillers having at least one of silver, alumina, crystalline silica, boron nitride or aluminum nitride; and a heat spreading stiffener secured to the attachment film.

Example 16 includes the electronic assembly of example 15, wherein the thermal conductive fillers have a thermal conductivity greater than 5 W/mK.

Example 17 includes the electronic assembly of any one of examples 15-16, wherein the panel is in strip form.

Example 18 includes the electronic assembly of any one of examples 15-17, wherein the panel is formed of silicon, metal and organic layers.

Example 19 includes the electronic assembly of any one of examples 15-18, wherein the heat spreading stiffener is a metal foil.

Example 20 includes the electronic assembly of any one of examples 15-19, wherein the metal foil is copper.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. In addition, the order of the methods described herein may be in any order that permits fabrication of an electrical interconnect and/or package that includes an electrical interconnect. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A stiffener tape for a wafer, the stiffener tape comprising:
   a mounting tape;
   a heat spreading stiffener removably attached to the mounting tape; and
   an attachment film secured to the heat spreading stiffener, wherein the attachment film includes thermal conductive fillers having at least one of silver, alumina, crystalline silica, boron nitride or aluminum nitride, wherein the heat spreading stiffener is larger than a size of the wafer.

2. The stiffener tape of claim 1, wherein the mounting tape is a polymer film, wherein the heat spreading stiffener is a metal foil.

3. The stiffener tape of claim 1, wherein the mounting tape, the attachment film and the heat spreading stiffener are formed into a roll.

4. An electronic assembly comprising:
- a wafer;
- a plurality of integrated circuits on the wafer;
- an attachment film covering the plurality of integrated circuits and the wafer, wherein the attachment film includes thermal conductive fillers having at least one of silver, alumina, crystalline silica, boron nitride or aluminum nitride; and
- a heat spreading stiffener secured to the attachment film, wherein the heat spreading stiffener is larger than the wafer.

5. The electronic assembly of claim 4, wherein the thermal conductive fillers have a thermal conductivity greater than 5 W/mK.

6. The electronic assembly of claim 4, wherein the wafer is formed of silicon, metal and organic layers.

7. The electronic assembly of claim 4, wherein the heat spreading stiffener is a metal foil.

8. The electronic assembly of claim 7, wherein the metal foil is copper.

9. A stiffener tape for a panel, the stiffener tape comprising:
- a mounting tape;
- a heat spreading stiffener removably attached to the mounting tape; and
- an attachment film secured to the heat spreading stiffener, wherein the attachment film includes thermal conductive fillers having at least one of silver, alumina, crystalline silica, boron nitride or aluminum nitride, wherein the heat spreading stiffener is larger than a size of the panel.

10. The stiffener tape of claim 9, wherein the mounting tape is a polymer film, wherein the heat spreading stiffener is a metal foil.

11. The stiffener tape of claim 9, wherein the mounting tape, the attachment film and the heat spreading stiffener are formed into a roll.

12. An electronic assembly comprising:
- a panel;
- a plurality of integrated circuits on the panel;
- an attachment film covering the plurality of integrated circuits and the panel, wherein the attachment film includes thermal conductive fillers having at least one of silver, alumina, crystalline silica, boron nitride or aluminum nitride; and
- a heat spreading stiffener secured to the attachment film, wherein the heat spreading stiffener is larger than a size of the panel.

13. The electronic assembly of claim 12, wherein the thermal conductive fillers have a thermal conductivity greater than 5 W/mK.

14. The electronic assembly of claim 12, wherein the panel is in strip form.

15. The electronic assembly of claim 12, wherein the panel is formed of silicon, metal and organic layers.

16. The electronic assembly of claim 12, wherein the heat spreading stiffener is a metal foil.

17. The electronic assembly of claim 16, wherein the metal foil is formed of copper.

\* \* \* \* \*